United States Patent
Yang et al.

(10) Patent No.: US 8,937,358 B2
(45) Date of Patent: Jan. 20, 2015

(54) CHANNEL DOPING EXTENSION BEYOND CELL BOUNDARIES

(71) Applicant: Taiwan Semiconductor Manufacturing Company, Ltd., Hsin-Chu (TW)

(72) Inventors: Kuo-Nan Yang, Hsin-Chu (TW); Chou-Kun Lin, Hsin-Chu (TW); Jerry Chang-Jui Kao, Taipei (TW); Yi-Chuin Tsai, Sing-Yan Township (TW); Chien-Ju Chao, New Taipei (TW); Chung-Hsing Wang, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/874,055

(22) Filed: Apr. 30, 2013

(65) Prior Publication Data
US 2014/0239412 A1   Aug. 28, 2014

Related U.S. Application Data

(60) Provisional application No. 61/770,222, filed on Feb. 27, 2013.

(51) Int. Cl.
*H01L 21/70* (2006.01)
*H01L 27/07* (2006.01)

(52) U.S. Cl.
CPC .................. *H01L 27/0705* (2013.01)
USPC ........... 257/391; 257/401; 257/205; 438/276; 438/279; 438/289

(58) Field of Classification Search
CPC .................. H01L 27/0705; H01L 27/0207
USPC ........... 257/391, 401, 205; 438/276, 279, 289
See application file for complete search history.

(56) References Cited

U.S. PATENT DOCUMENTS

2004/0213029 A1 * 10/2004 Hirata et al. .................. 365/104

* cited by examiner

*Primary Examiner* — Tu-Tu Ho
(74) *Attorney, Agent, or Firm* — Slater & Matsil, L.L.P.

(57) ABSTRACT

An integrated circuit includes a first and a second standard cell. The first standard cell includes a first gate electrode, and a first channel region underlying the first gate electrode. The first channel region has a first channel doping concentration. The second standard cell includes a second gate electrode, and a second channel region underlying the second gate electrode. The second channel region has a second channel doping concentration. A dummy gate includes a first half and a second half in the first and the second standard cells, respectively. The first half and the second half are at the edges of the first and the second standard cells, respectively, and are abutted to each other. A dummy channel is overlapped by the dummy gate. The dummy channel has a third channel doping concentration substantially equal to a sum of the first channel doping concentration and the second channel doping concentration.

20 Claims, 14 Drawing Sheets

CHANNEL DOPING EXTENSION BEYOND CELL BOUNDARIES

This application claims the benefit of the following provisionally filed U.S. patent application: Application Ser. No. 61/770,222, filed Feb. 27, 2013, and entitled "Channel Doping Extension beyond Cell Boundaries;" which application is hereby incorporated herein by reference.

BACKGROUND

Threshold voltage is one of important characteristics that affect the performance of a transistor. The threshold voltage of a transistor is often affected by its well doping concentration. To increase the threshold voltage of a transistor, the channel doping concentration may be increased, and vice versa.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 7B are cross-sectional views and top views of intermediate stages in the manufacturing of standard cells comprising Poly on OD Edge (PODE) devices in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Standard cells comprising transistors and Poly on OD Edge (PODE) devices and the method of forming the same are provided in accordance with various exemplary embodiments. The intermediate stages of forming the cells are illustrated. The variations of the embodiments are discussed. Throughout the various views and illustrative embodiments, like reference numbers are used to designate like elements.

Figure 1:
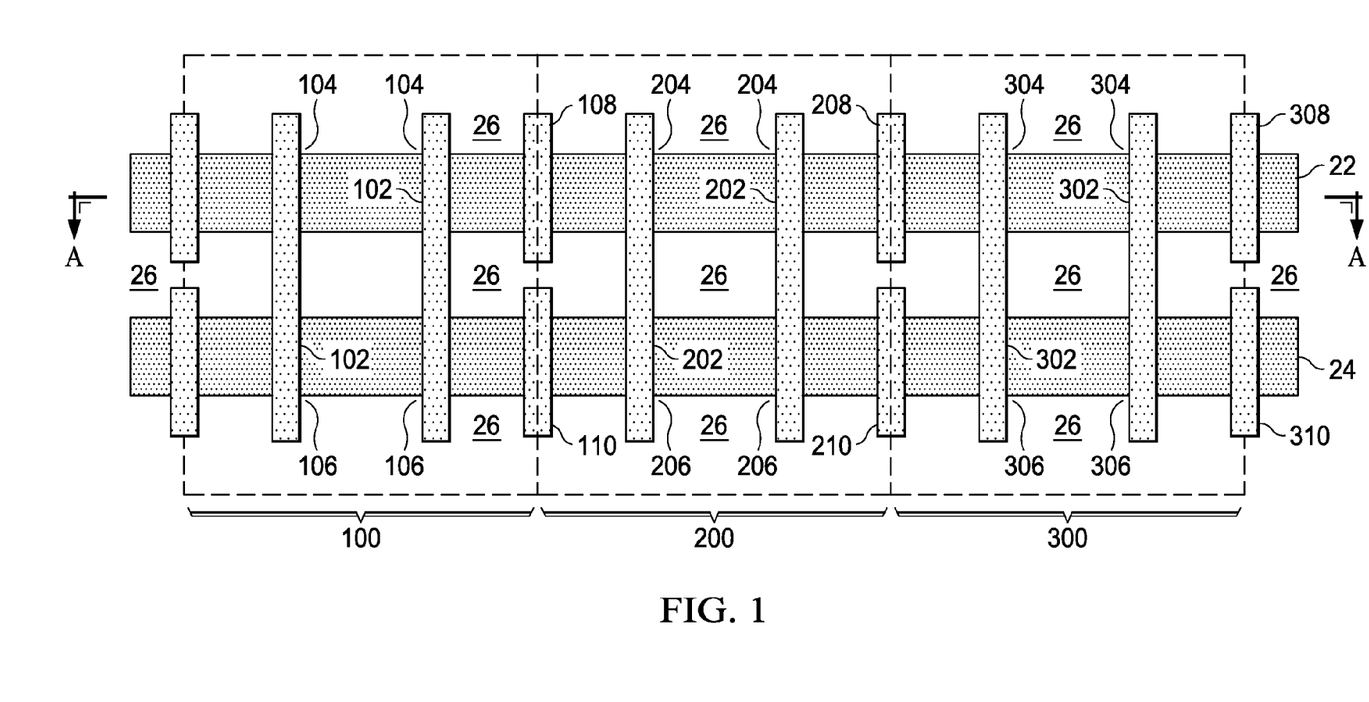

FIG. 1 illustrates a top view of an integrated circuit structure, which includes cells 100, 200, and 300 that are butted to form a row of cells. Cells 100, 200, and 300 may be standard cells, and may include, for example, inverters, NOR gates, AND gates, or the like. In the design of the integrated circuits, the standard cells are pre-designed, and are copied, placed, and routed to form integrated circuits. To explain the concept of the present disclosure, cells 100, 200 and 300 are shown as including gate electrodes 102, 202, and 302, respectively, which form PMOS device 104, 204, and 304 with the underlying continuous active region (sometimes referred to as an OD region hereinafter) 22. Gate electrodes 102, 202, and 302 further form NMOS devices 106, 206, and 306 with the underlying continuous active region 24. It is appreciated, however, that cells 100, 200, and 300 may have structures different from what is shown in FIG. 1.

PODEs 108, 110, 208, 210, 308, and 310 are formed at the edges of cells 100, 200, and 300. The PODEs are dummy gate electrodes that do not function as the gates of functional transistors. PODEs 108, 110, 208, 210, 308, and 310 are such named since they may be formed of polysilicon, and may be formed simultaneously as the formation of the gate electrodes of MOS transistors 104, 106, 204, 206, 304, and 306. Each of PODEs 108, 110, 208, 210, 308, and 310 is formed to extend into two abutted cells, with the edges of the abutted cells aligned to the middle line of the respective PODEs. Alternatively stated, each of PODEs 108, 110, 208, 210, 308, and 310 includes a half in each of two neighboring cells. When the respective integrated circuits are operated, PODEs 108, 110, 208, 210, 308, and 310 may be electrically floating. Alternatively, PODEs 108, 208, and 308 may be tied to VDD when they are on the source side of (and possibly adjoin) PMOS transistors. PODEs 110, 210, and 310 may be tied to VSS when they are on the source side of (and possibly adjoin) the NMOS transistors.

Active region 22 continuously extends into cells 100, 200, and 300, and is used for forming PMOS transistors. Active region 24 continuously extends into cells 100, 200, and 300, and is used for forming NMOS transistors. The channel regions of transistors 104, 204, and 304 are overlapped by gate electrodes 102, 202, and 302, which channel regions have channel doping. The channel doping of PMOS transistors 104, 204, and 304 is n-type, and the channel doping of NMOS transistors 106, 206, and 306 is p-type. The channel doping affects the threshold voltage (Vt) of the respective transistor. For example, for NMOS transistors 104, 204, and 304, heavier channel doping results in higher Vt, and vice versa. For PMOS transistors 106, 206, and 306, heavier channel doping also results in higher Vt, and vice versa. In the exemplary embodiments, it is assumed that PMOS transistors 204 and 304 have threshold voltage Vt2, which is different from the threshold voltage Vt1 of PMOS transistor 104.

Figure 2:
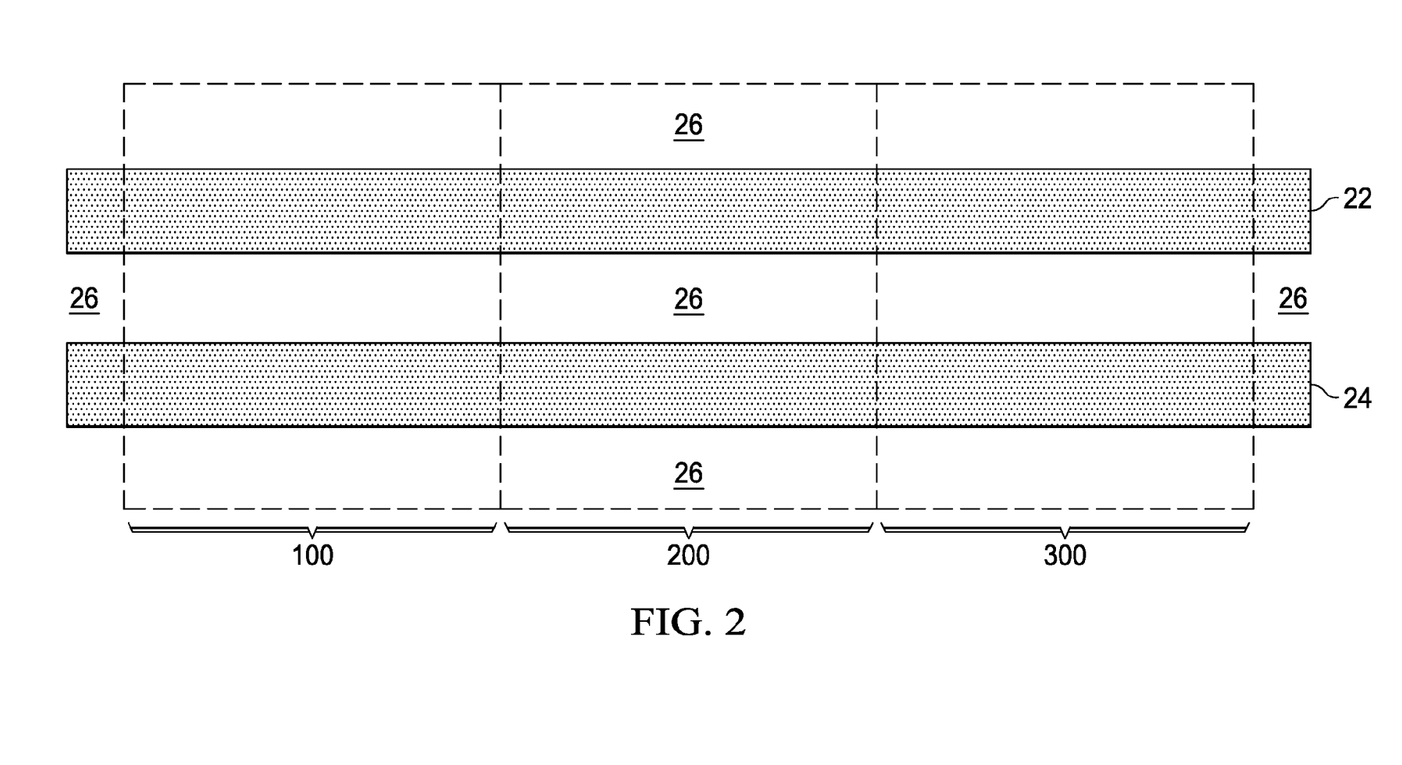

FIGS. 2 through 7B illustrate the top views and cross-sectional views in the formation of cells 100, 200, and 300 (FIG. 1) in accordance with exemplary embodiments. Referring to FIG. 2, active regions 22 and 24 are formed, which formation process includes forming Shallow Trench Isolation (STI) regions 26 to define the boundaries of active regions 22 and 24. Active regions 22 and 24 may be the active regions of planar MOS transistors. Alternatively, active regions 22 and 24 are semiconductor fins protruding above the top surface of STI regions 26, and transistors 104, 106, 204, 206, 304, and 306 are FinFETs.

Figure 3A:
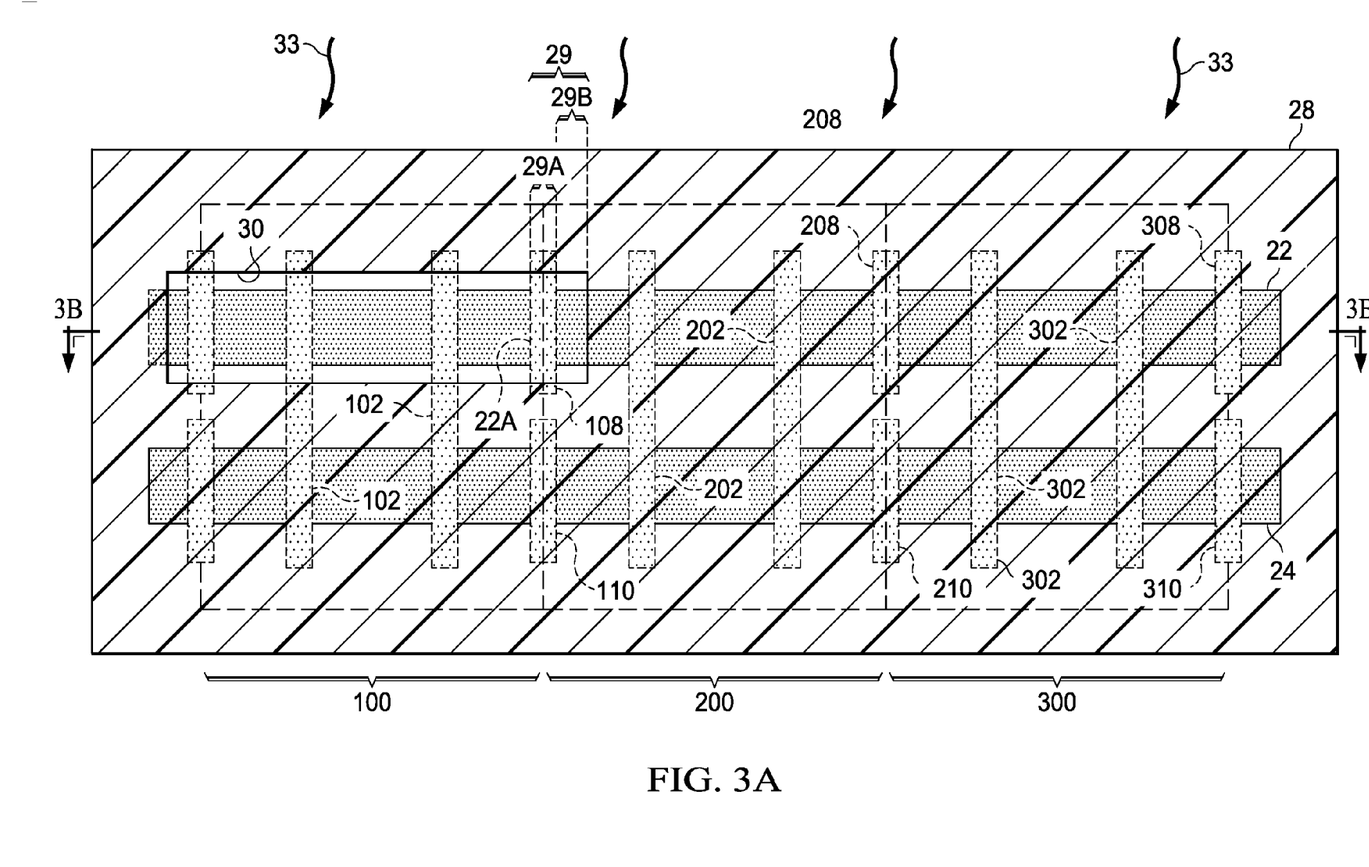

FIG. 3A illustrates the formation of mask layer 28, which may be a photo resist, for example. At this time, gate electrodes 102, 202, and 302 and PODEs 108, 110, 208, 210, 308, and 310 have not been formed yet. Hence, dashed lines are used to mark their future positions. Opening 30 is formed in mask layer 28 to expose the portion of active region 22 in cell 100 and portion 29B of active region 22 in cell 200, wherein the exposed portion 29B in cell 200 is adjacent to the edge, and does not extend to where gate electrodes 202 are to be formed. The exposed portions of active region 22 includes portion 22A, which is to be covered by PODE 108 in a subsequent step. A half of portion 29A of active region 22 is also in cell 200, which half is to be covered by future PODE 108. Portion 29B of active region 22 adjoins portion 29A. Throughout the description, portions 29A is referred to as a PODE channel (also referred to as a dummy channel). After the formation of mask layer 28, a channel doping is performed through implantation 33, wherein mask layer 28 is used as an implantation mask. Accordingly, a portion of active region 22 in cell 100 and a portion of active region 22 in cell 200 are implanted simultaneously.

Figure 3B:
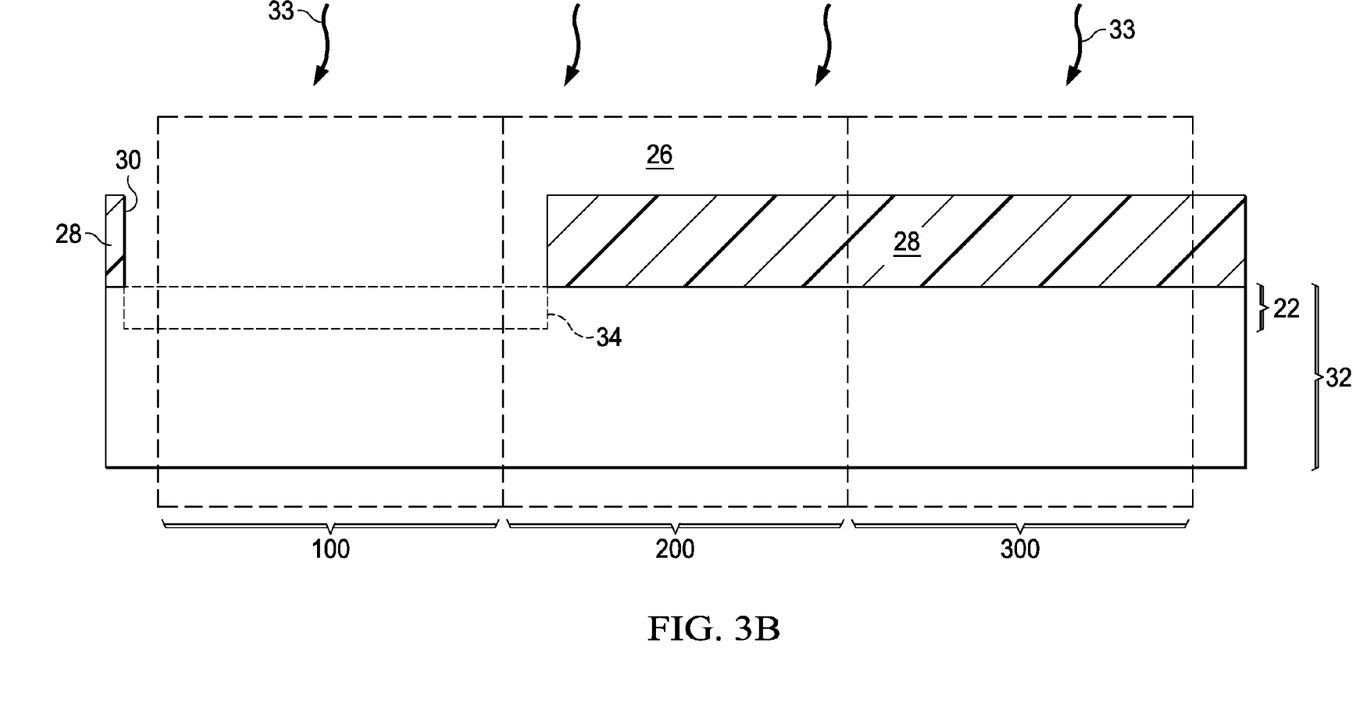

FIG. 3B illustrates a cross-sectional view of the structure in FIG. 3A, wherein the cross-sectional view is obtained from the plan crossing line 3B-3B in FIG. 3A. As shown in FIG. 3B, active region 22, which is a portion of semiconductor substrate 32 defined by STI regions 26 (FIG. 1), is implanted to form the channel doping region 34. In some embodiments, in implantation 33, an n-type impurity such as phosphorous, arsenic, and antimony is implanted, for example. The resulting channel doping region 34 has a first n-type impurity concentration CDC1 between about $10^{15}/cm^3$ and about $10^{19}/cm^3$, for example. It is appreciated, however, that the values recited throughout the description are merely examples, and may be changed to different values. The first n-type impurity concentration CDC1 is selected so that the resulting PMOS transistor 104 in cell 100 (FIG. 1) has a first desirable threshold voltage Vt1.

Figure 4:
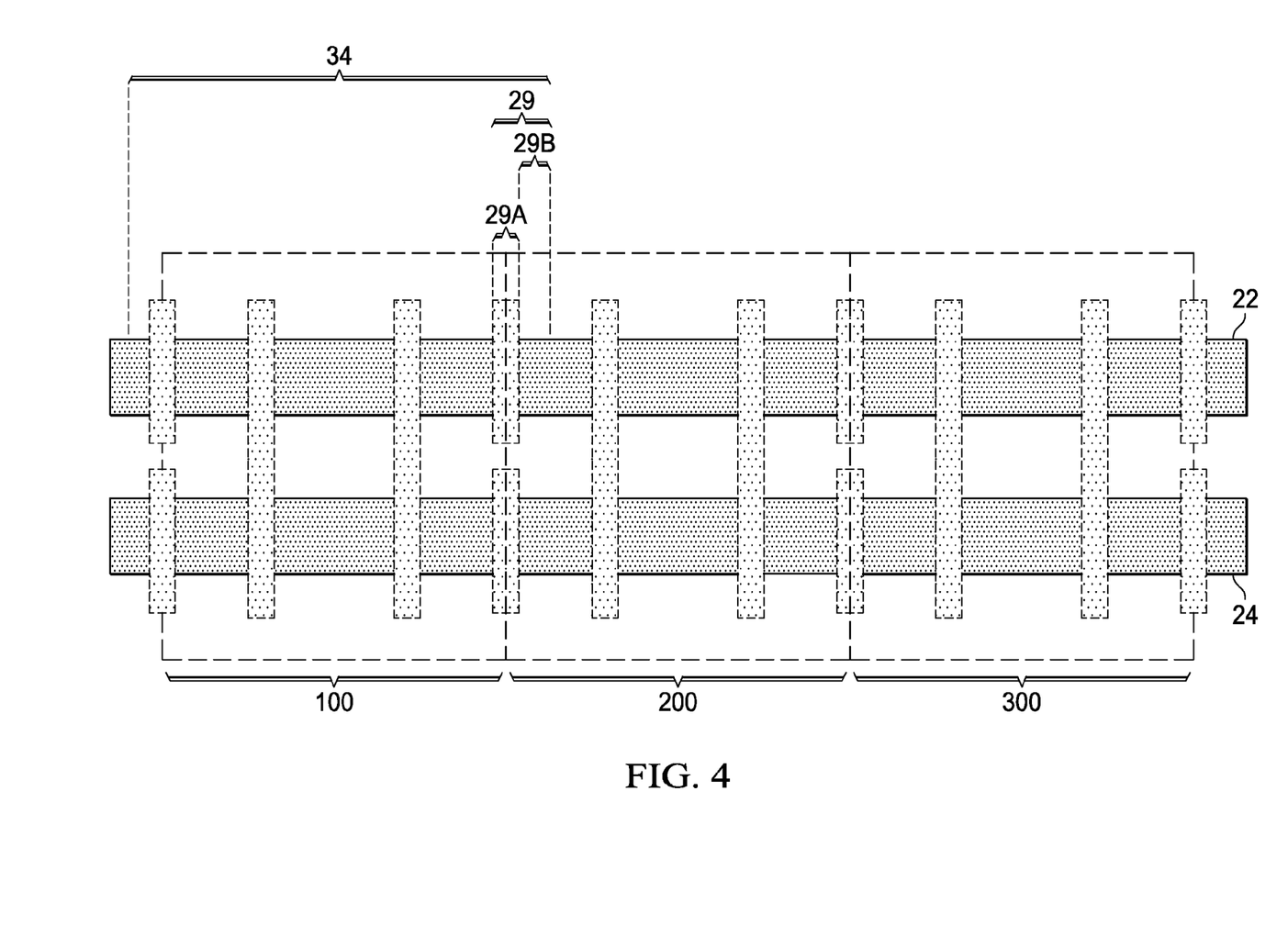
Figure 5A:
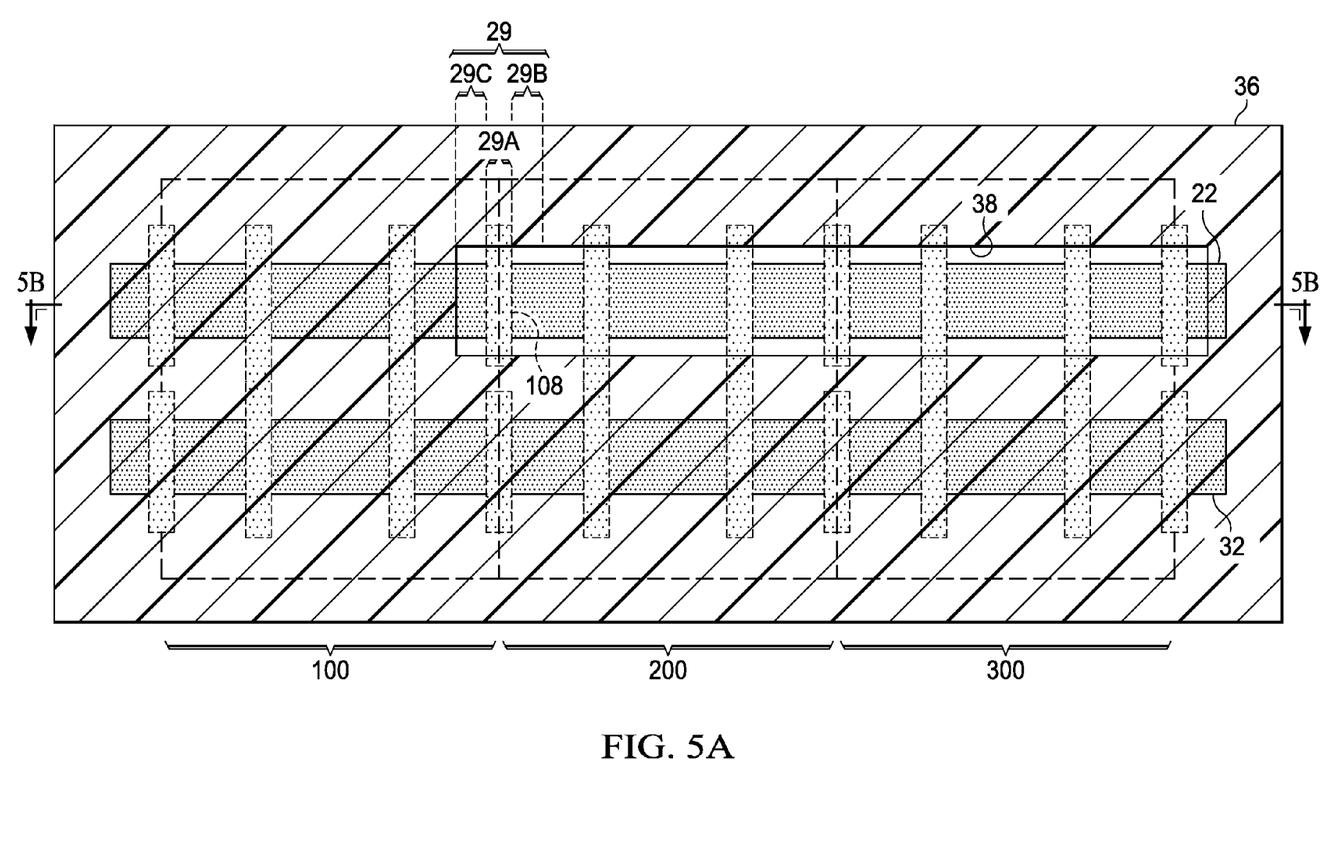

Next, mask layer 28 is removed, and the resulting structure is shown in FIG. 4. The resulting channel doping region 34 is shown in FIG. 4. Next, as shown in FIG. 5A, mask layer 36 is formed, which may be a photo resist, for example. Opening 38 is formed in mask layer 36 to expose the portion of active region 22 in cells 200 and 300. In addition, portions 29A and 29C of active region 22 in cell 100 is exposed through opening 38, wherein the exposed portions 29A and 29C join the portion of active region 22 in cells 200 and 300. A channel doping is then performed using mask layer 36 as an implantation mask. Accordingly, the portions of active region 22 in cells 200 and 300 and portions 29A and 29B of active region 22 in cell 100 are implanted.

Figure 5B:
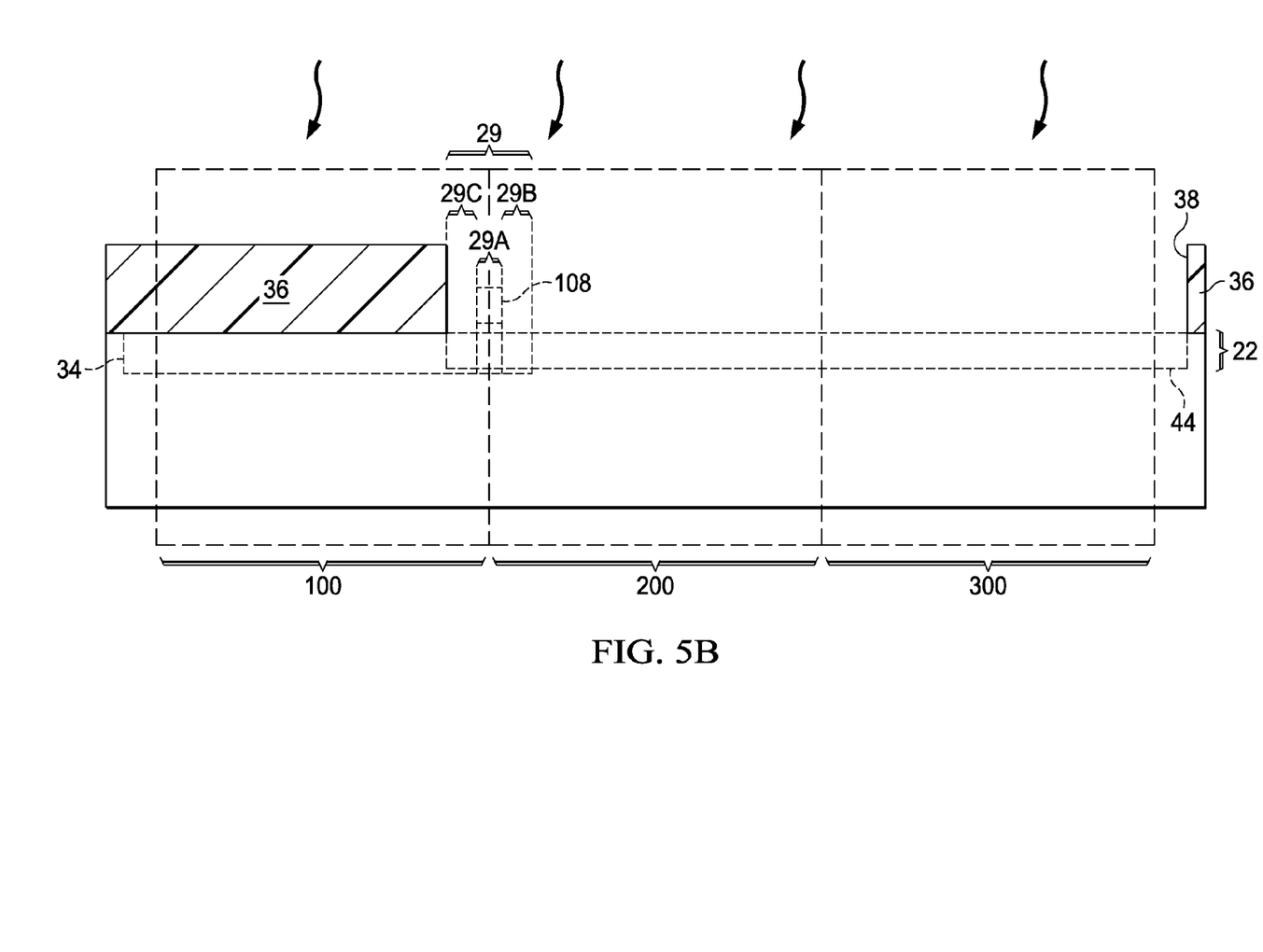

FIG. 5B illustrates a cross-sectional view of the structure in FIG. 5A, wherein the cross-sectional view is obtained from the plan crossing line 5B-5B in FIG. 5A. As shown in FIG. 5B, active region 22 is implanted to form channel doping region 44. In some embodiments, in the implantation, an n-type impurity such as phosphorous, arsenic, antimony, is implanted, for example. The resulting channel doping region 44 has a second n-type impurity concentration between about $10^{15}/cm^3$ and about $10^{19}/cm^3$, for example. The second n-type impurity concentration is designed so that the resulting PMOS transistors 204 and 304 (FIG. 1) have second desirable threshold voltages Vt2 different from the first threshold voltage Vt1 of transistor 104. Accordingly, the second channel doping concentration is different from the first channel doping concentration, which is performed in the step in FIGS. 3A and 3B. In some exemplary embodiments, a ratio of the second channel doping concentration to the first channel doping concentration is between about 2 and about 10.

As shown in FIG. 5B, channel doping regions 34 and 44 overlap with each other, wherein the overlap region is marked as region 29. Channel doping region 29 receive both the implanted n-type impurity in the first channel doping, as shown in FIGS. 3A and 3B, and the implanted n-type impurity in the second channel doping, as shown in FIGS. 5A and 5B. The doping concentration in channel doping region 29 is hence the sum of the doping concentration caused by the first n-type impurity concentration in FIGS. 3A and 3B and the doping concentration caused by the second n-type impurity concentration in FIGS. 5A and 5B. The position of PODE 108, which will be formed in a subsequent step, is schematically illustrated in FIG. 5B. It is appreciated that PODE 108 and doping region 29 (which includes 29A, 29B, and 29C) form a parasitic transistor. Since the left half and the right half of PODE channel 29A have a same channel doping concentration, the parasitic transistor has symmetric threshold voltage Vt, which is higher than both Vt1 and Vt2. The parasitic transistor having the symmetric threshold voltage is easier to simulate than a transistor having an asymmetric threshold voltage.

Figure 6:
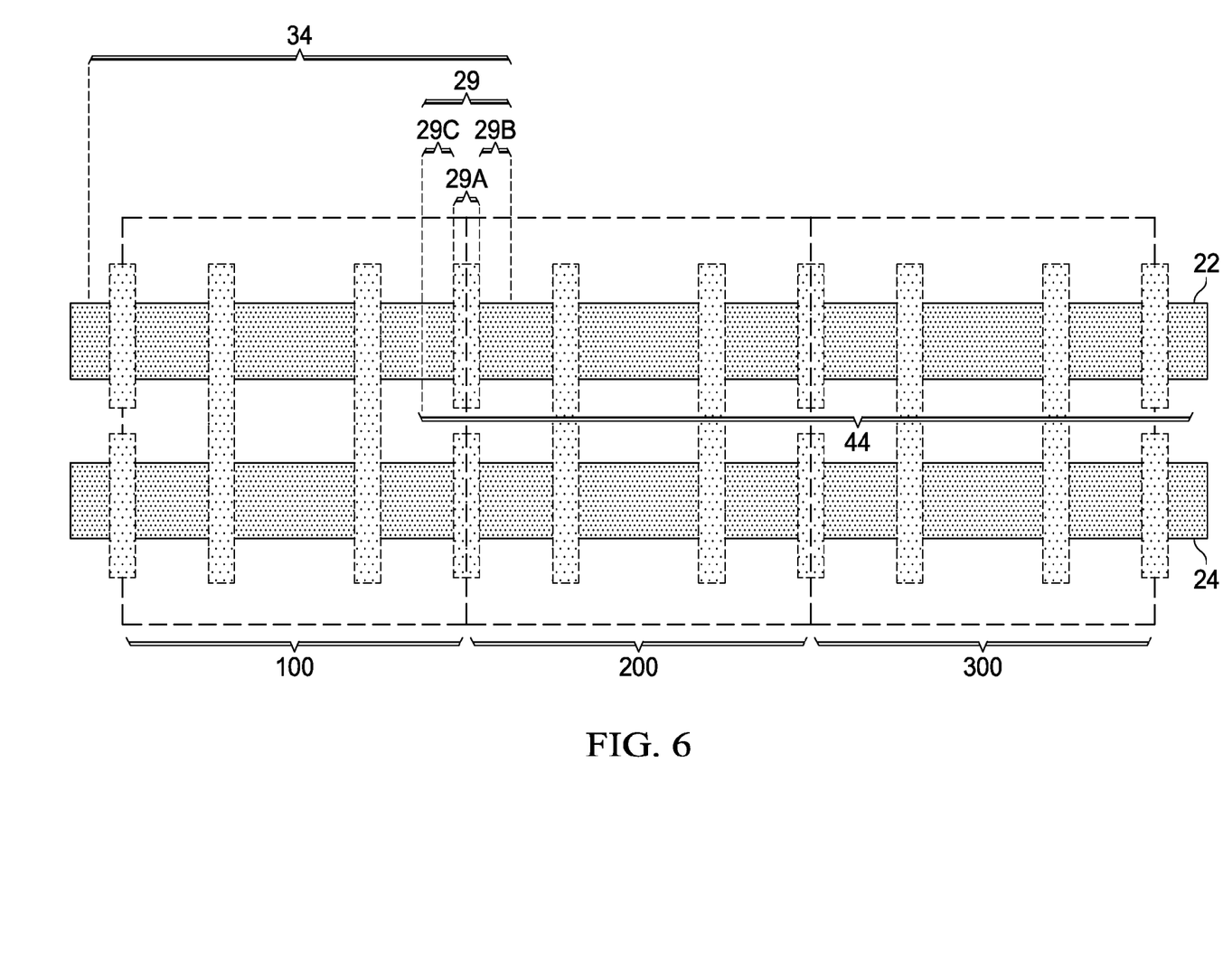
Figure 7A:
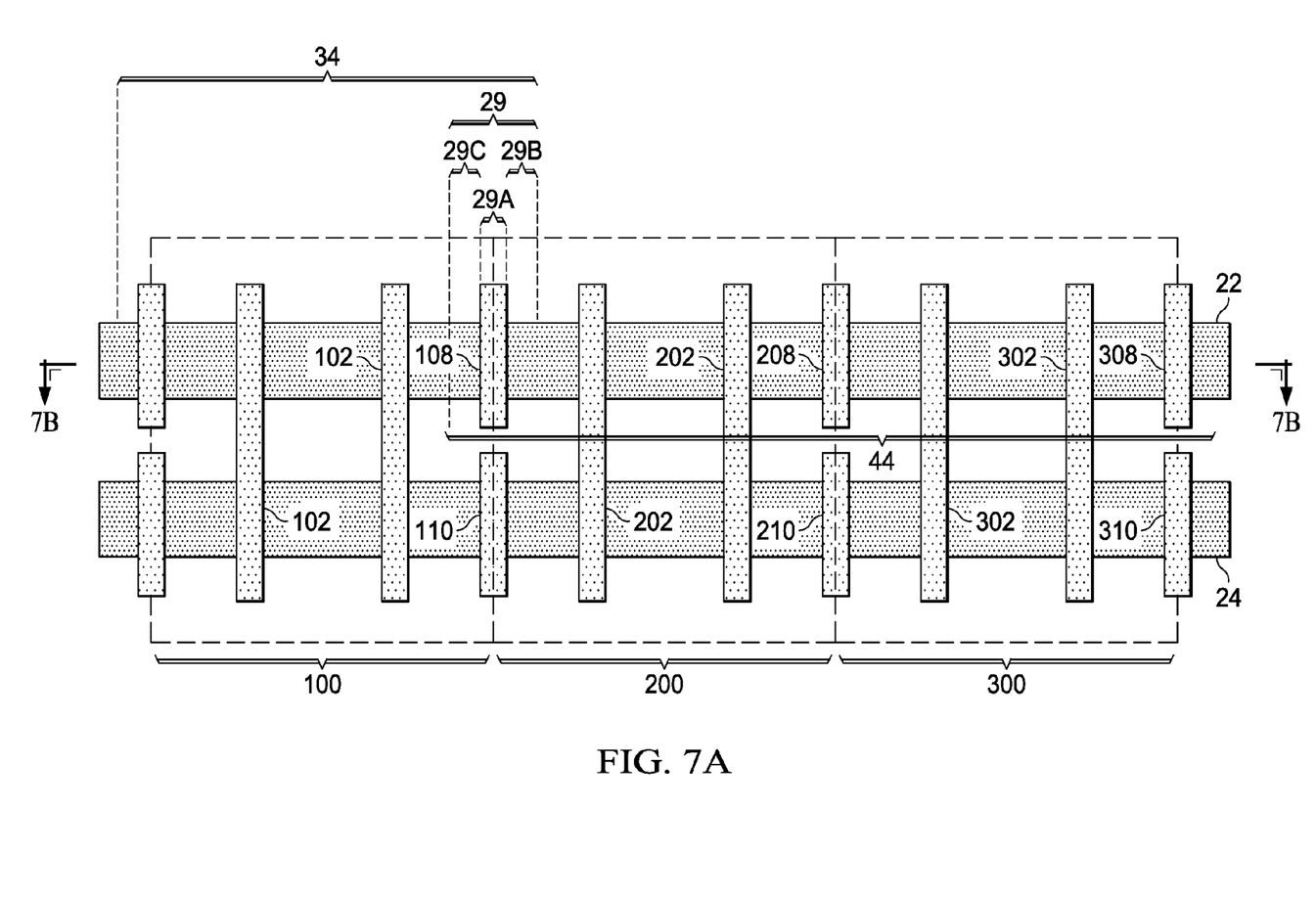
Figure 7B:
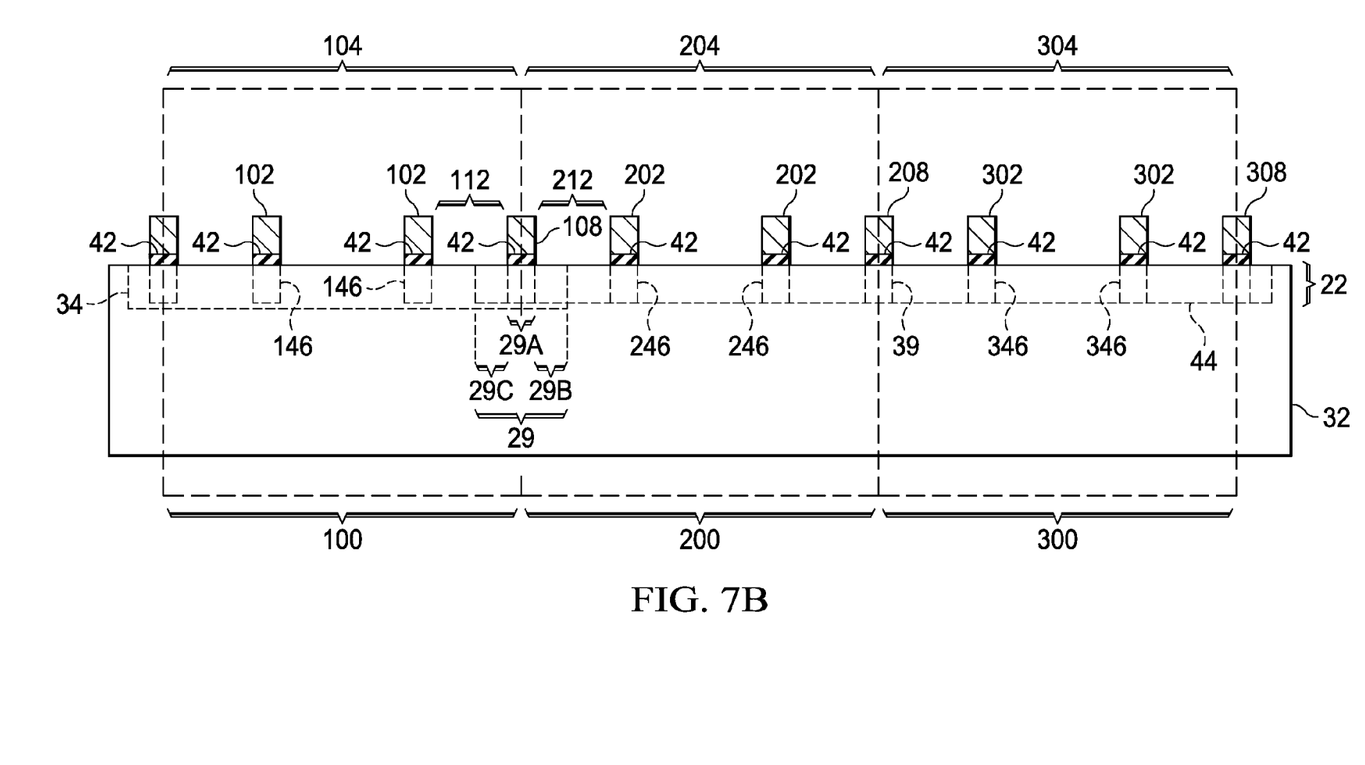

Mask layer 36 is then removed, and the resulting structure is shown in FIG. 6. Next, as shown in FIG. 7A, gate electrodes 102, 202, and 302 and PODEs 108, 110, 208, 210, 308, and 310 are formed. FIG. 7B illustrates a cross-sectional view of the structure in FIG. 7A, wherein the cross-sectional view is obtained from the plan crossing line 7B-7B in FIG. 7A. As shown in FIG. 7B, gate electrodes 102, 202, and 302 and PODEs 108, 208, and 308 are formed over gate dielectrics 42. PODEs 110, 210, and 310 are also formed over gate dielectrics 42, although PODEs 110, 210, and 310 are not shown in FIG. 7B. Channel regions 146, 246, and 346 are formed in cells 100, 200, and 300, respectively. Channel regions 146 are parts of channel doping region 34, and hence have the first channel doping concentration CDC1. Channel regions 246 and 346 are parts of channel doping region 44, and hence have the second channel doping concentration CDC2. PODE channel 29A has the channel doping concentration (CDC1+CDC2), and PODE channel 39, which is under PODE 208, has the channel doping concentration CDC2.

FIGS. 2 through 7B illustrate the channel doping of PMOS transistors 104, 204, and 304 in FIG. 1. The channel doping of NMOS transistors 106, 206, and 306 (FIG. 1) may be performed using essentially the same processes in FIGS. 2 through 7B, except that the active region 22 in FIGS. 2 through 7B is replaced by active region 24, and the channel doping is performed using a p-type impurity.

FIGS. 8 through 11 illustrate the formation of cells in accordance with alternative embodiments. The resulting structure formed using the process in FIGS. 8 through 11 is also illustrated in FIG. 1. Unless specified otherwise, the materials and formation methods of the components in these embodiments are essentially the same as the like components, which are denoted by like reference numerals in the embodiments shown in FIGS. 2 through 7B. The details regarding the formation process and the materials of the components shown in FIGS. 8 through 11 may thus be found in the discussion of the embodiment shown in FIGS. 2 through 7B. The cross-sectional views in FIGS. 8 through 11 are obtained from the plane crossing line A-A in FIG. 1.

Figure 8:
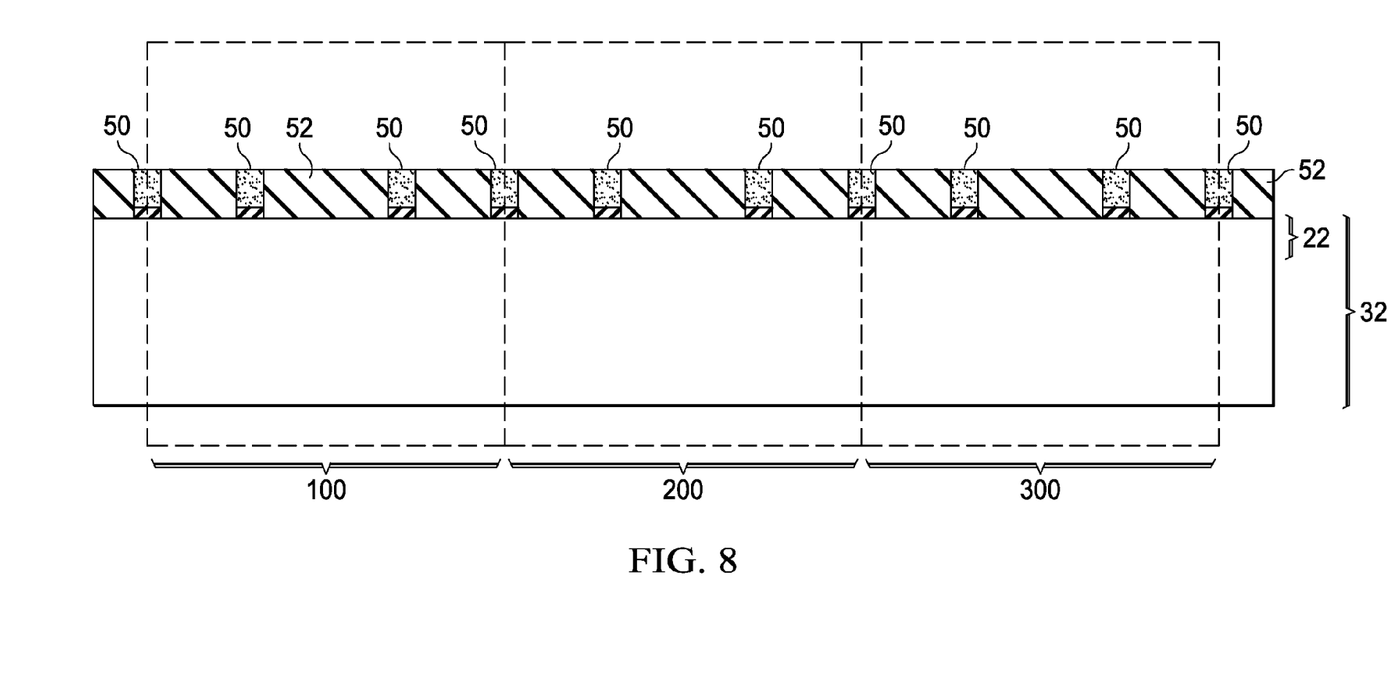
FIGS. 8 through 11 are cross-sectional views of intermediate stages in the manufacturing of standard cells comprising PODE devices in accordance with some alternative embodiments.

Referring to FIG. 8, dummy gate stacks 50 are formed. The positions of dummy gate stacks 50 are where 102, 202, and 303 and PODEs 108, 110, 208, 210, 308, and 310 (FIG. 1) are to be formed in subsequent steps. Next, dielectric layer 52 is formed. Dielectric layer 52 may include gate spacers (not shown) on the sidewalls of dummy gate stacks 50, and an Inter-Layer Dielectric (ILD) filling the spaces between the gate spacers.

Figure 9:
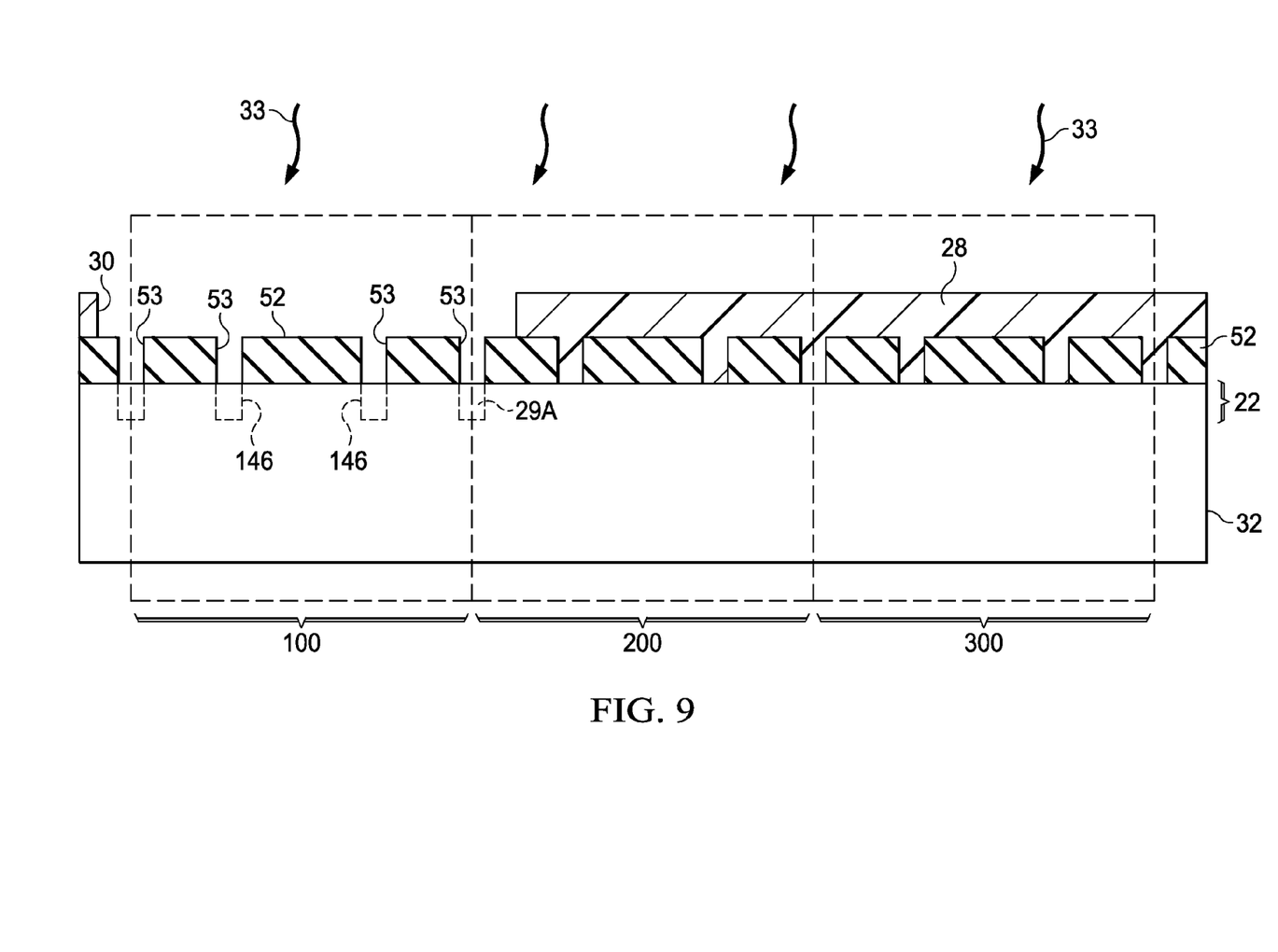

Next, as shown in FIG. 9, dummy gate stacks 50 are removed, leaving openings 53 in dielectric layer 52. Mask layer 28 is then formed, with opening 30 formed therein. Opening 30 may be formed at the same position, and having same size, as opening 30 in FIGS. 3A and 3B. Channel doping 33 is then performed, for example, using the same impurity, and to the same concentration, as in FIGS. 3A and 3B. The impurity is implanted into active region 22 through openings 30 and 53. As a result, channels regions 146 are formed, and have a channel doping concentration equal to CDC1. In these embodiments, however, channels regions 146 are discrete regions, and are not parts of a continuous channel doping region 34 as shown in FIG. 7B.

Figure 10:
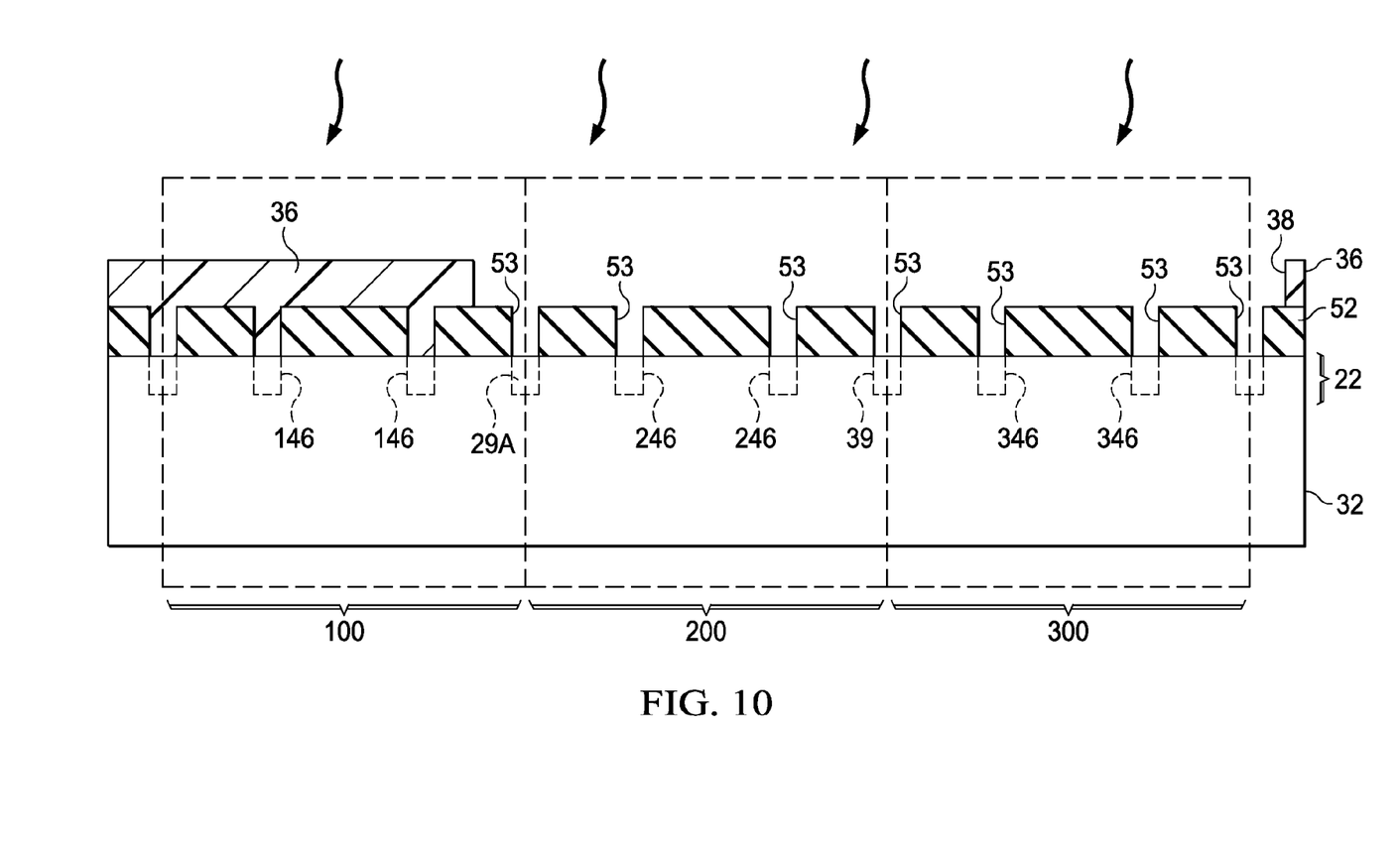
Figure 11:
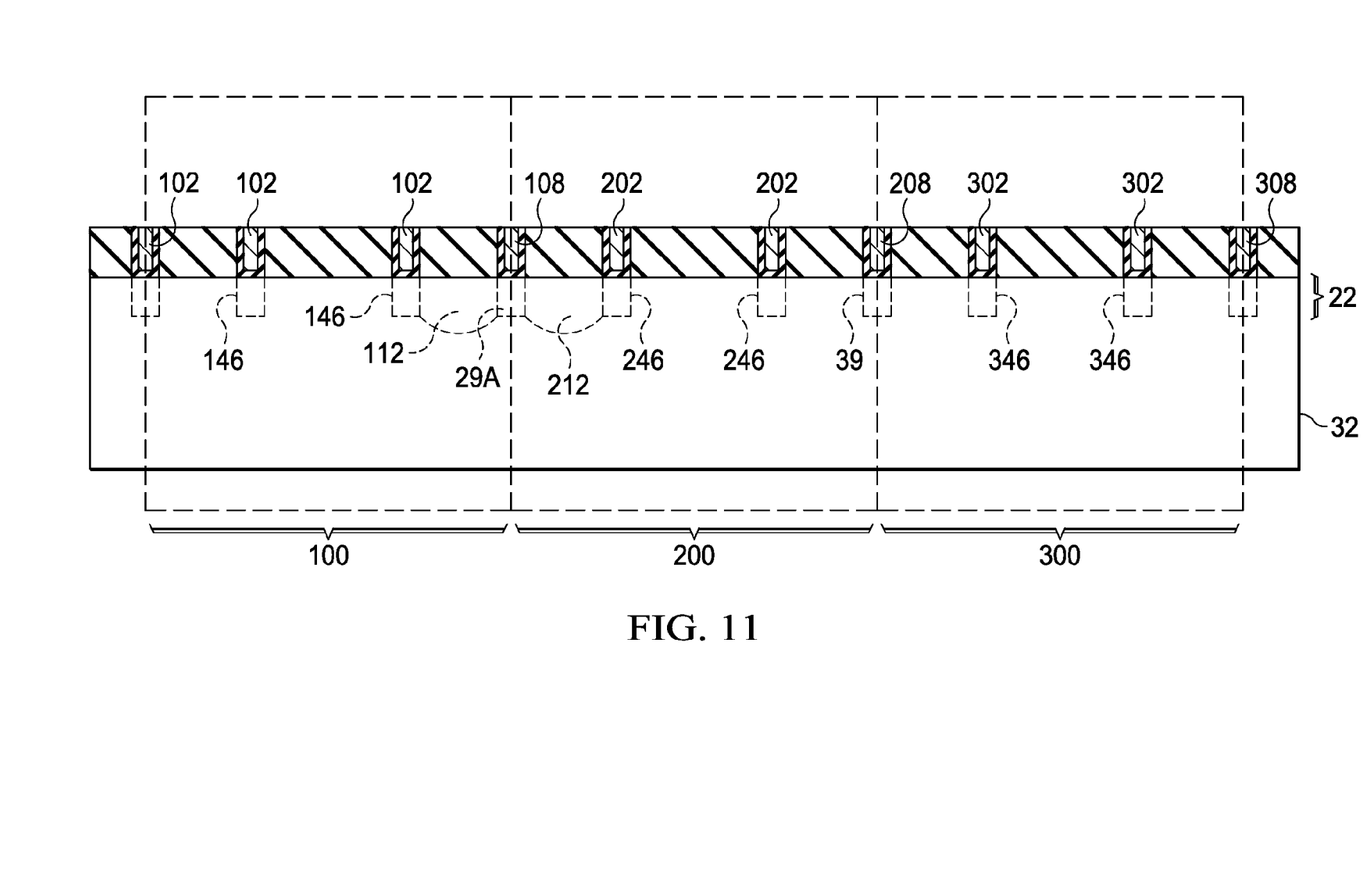

Next, mask layer 28 is removed, and mask layer 36 is formed, with opening 38 formed therein. The respective structure is shown in FIG. 10. Similarly, opening 38 may be formed at the same position, and has a similar size, as mask layer opening 38 in FIGS. 5A and 5B. Channel doping region 44 is then performed, for example, through an implantation using the same impurity, and to the same concentration, as in FIGS. 5A and 5B. The impurity is implanted into active region 22 through openings 38 and 53. As a result, channels regions 246 and 346 and PODE channel 39 are formed, and have a channel doping concentration equal to CDC2. In these embodiments, however, 246 and 346 and PODE channel 39 are discrete regions, and are not parts of a continuous channel doping region 44 as shown in FIG. 7B. Mask layer 36 is then removed. As shown in FIGS. 9 and 10, since PODE channel 29 receive two channel doping, one in the step shown in FIG. 9, and one in the step in FIG. 10, the channel doping concentration in PODE channel 29A is equal to (CDC1+CDC2). It is observed that PODE channel 29A includes a first portion in cell 100 and a second portion in cell 200. In accordance with the embodiments of the present disclosure, the first portion and the second portion have a same channel doping concentration, resulting in a parasitic PODE device having a symmetric threshold voltages Vt. FIG. 11 illustrates the formation of replacement gate electrodes 102, 202, and 302, and PODEs 108, 110, 208, 210, 308, and 310. The formation may be performed using a gate-last approach, and the details are not discussed herein.

FIGS. 8 through 11 illustrate the channel doping of PMOS transistors 104, 204, and 304 in FIG. 1. The channel doping of NMOS transistors 106, 206, and 306 (FIG. 1) may be performed using essentially the same processes in FIGS. 8 through 11, except that the active region 22 in FIGS. 8 through 11 is replaced by active region 24, and the channel doping is performed using a p-type impurity.

In FIGS. 7B and 11, MOS transistor 104 include source or drain region (referred to as source/drain region hereinafter) 112, which is heavily doped, for example, with a p-type impurity concentration between about $10^{19}/cm^3$ and about $10^{22}/cm^3$. MOS transistor 204 include source/drain region 212, which is heavily doped, for example, with a p-type impurity concentration between about $10^{19}/cm^3$ and about $10^{22}/cm^3$. Throughout the description, the term "source/drain region" refers to a source region or a drain region. Source/drain regions 112 and 212 are on opposite sides of, and are in contact with PODE channel 29A. In addition, PODE 108 forms a parasitic transistor with PODE channel 29A, wherein source/drain regions 112 and 212 act as a source and a drain. The threshold voltage of the resulting PODE transistor is higher than the threshold voltages of both MOS transistors 104 and 204 due to the higher channel doping concentration in PODE channel 29A.

In the embodiments of the present disclosure, since the channel doping regions are designed to expand to neighboring cells when the channel region of one cell is doped. The PODE device, which is a parasitic device formed of a PODE and its underlying PODE channel, has a symmetric doping in two halves of the PODE channel, with the channel doping of the two halves of the PODE channel in two cells having the same doping concentration. As a comparison, if in the channel doping, the doped active region is limited to the active region in the respective cell, then a PODE channel may have a first half in the first cell and having a first doping concentration, and a second half in the second cell and having a second doping concentration different from the first doping concentration, resulting in a device having an asymmetric Vt. The device with the asymmetric Vt is difficult to simulate, and hence its performance and its affect to the integrated circuit is difficult to predict.

In accordance with some embodiments, an integrated circuit includes a first and a second standard cell. The first standard cell includes a first gate electrode, and a first channel region underlying the first gate electrode. The first channel region has a first channel doping concentration. The second standard cell includes a second gate electrode, and a second channel region underlying the second gate electrode. The second channel region has a second channel doping concentration. A dummy gate includes a first half and a second half in the first and the second standard cells, respectively. The first half and the second half are at the edges of the first and the second standard cells, respectively, and are abutted to each other. A dummy channel is overlapped by the dummy gate. The dummy channel has a third channel doping concentration substantially equal to a sum of the first channel doping concentration and the second channel doping concentration.

In accordance with other embodiments, an integrated circuit includes a semiconductor substrate, a continuous active region in the semiconductor substrate, and a first transistor and a second transistor having a first threshold voltage and a second threshold voltage, respectively. The first transistor includes a first gate electrode overlying the continuous active region, and a first source/drain region on a side of the first gate electrode. The second transistor includes a second gate electrode overlying the continuous active region, and a second source/drain region on a side of the second gate electrode. A dummy gate electrode is overlying the continuous active region. The dummy gate electrode, the first source/drain region, and the second source/drain region form a parasitic transistor, which has a third threshold voltage greater than the first threshold voltage and the second threshold voltage.

In accordance with yet other embodiments, a method includes forming a first mask layer over an active region, wherein the active region extends into a first cell and a second cell abutting the first cell, and wherein the active region comprises a border portion including a first portion in the first cell and a second portion in the second cell. The first mask layer is patterned to form a first opening. The border portion of the active region and a first channel portion of the active region are exposed through the first opening, wherein the first channel portion is in the first cell. A first channel doping is performed to dope the border portion of the active region and the first channel portion of the active region simultaneously. The first mask layer is then removed. A second mask layer is formed over the active region. The second mask layer is patterned to form a second opening. The border portion of the active region and a second channel portion of the active region are exposed through the second opening, wherein the second channel portion is in the second cell. A second channel doping is performed to dope the border portion of the active region and the second channel portion of the active region simultaneously. The second mask layer is then removed. A first and a second gate electrode are formed to overlap the first and the second channel portions to form a first and a second transistor, respectively. A dummy gate electrode is formed to overlap the boarder portion, wherein the dummy gate electrode extends into the first and the second cells.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit comprising:
a first standard cell, wherein the first standard cell comprises:
a first gate electrode;
a first channel region underlying the first gate electrode, wherein the first channel region has a first channel doping concentration; and
a first half of a dummy gate at a first edge of the first standard cell;
a second standard cell abutting the first standard cell, wherein the second standard cell comprises:
a second gate electrode;
a second channel region underlying the second gate electrode, wherein the second channel region has a second channel doping concentration; and
a second half of the dummy gate at a second edge of the second standard cell, wherein the first half and the second half of the dummy gate are abutted to each other; and
a dummy channel overlapped by the dummy gate, wherein the dummy channel has a third channel doping concentration substantially equal to a sum of the first channel doping concentration and the second channel doping concentration.

2. The integrated circuit of claim 1, wherein the first channel, the second channel, and the dummy channel are portions of a continuous active region.

3. The integrated circuit of claim 1, wherein the first gate electrode is comprised in a first transistor, and the second gate electrode is comprised in a second transistor, with no additional transistors located between the first transistor and the second transistor.

4. The integrated circuit of claim 1, wherein the second standard cell further comprises a third edge, wherein the second edge and the third edge are opposite edges of the second standard cell, and are parallel to each other, and wherein the integrated circuit further comprises:
a half of an additional dummy gate at the third edge of the second standard cell; and
and additional dummy channel underlying the additional dummy gate, wherein the additional dummy channel has a fourth channel doping concentration equal to the second channel doping concentration.

5. The integrated circuit of claim 1, wherein the first gate electrode is comprised in a PMOS transistor, and wherein the first channel doping concentration is a concentration of n-type impurities in the first channel region.

6. The integrated circuit of claim 1, wherein the first gate electrode is comprised in an NMOS transistor, and wherein the first channel doping concentration is a concentration of p-type impurities in the first channel region.

7. The integrated circuit of claim 1, wherein the dummy gate is electrically floating.

8. An integrated circuit comprising:
a semiconductor substrate;
a continuous active region in the semiconductor substrate;
a first transistor having a first threshold voltage, wherein the first transistor comprises:
a first gate electrode overlying the continuous active region; and
a first source/drain region on a side of the first gate electrode;
a second transistor having a second threshold voltage, wherein the second transistor comprises:
a second gate electrode overlying the continuous active region;
a second source/drain region on a side of the second gate electrode; and
a dummy gate electrode over the continuous active region, wherein the dummy gate electrode, the first source/drain region, and the second source/drain region form a parasitic transistor, and wherein the parasitic transistor has a third threshold voltage greater than the first threshold voltage and the second threshold voltage; and
a dummy channel overlapped by the dummy gate electrode, wherein a channel doping concentration in the dummy channel is substantially equal to a sum of a first channel doping concentration in a first channel of the first transistor and a second channel doping concentration in a second channel of the second transistor.

9. The integrated circuit of claim 8, wherein the first transistor and the second transistor are NMOS transistors, and wherein the channel doping concentration in the dummy channel, the first channel doping concentration, and the second channel doping concentration are concentrations of p-type impurities.

10. The integrated circuit of claim 8, wherein the dummy channel adjoins a source region of a PMOS device, and wherein the dummy gate electrode is electrically connected to VDD.

11. The integrated circuit of claim 8, wherein the dummy channel adjoins a source region of an NMOS device, and wherein the dummy gate electrode is electrically connected to VSS.

12. The integrated circuit of claim 8, wherein the dummy gate electrode is electrically floating.

13. The integrated circuit of claim 8, wherein the first gate electrode, the second gate electrode, and the dummy gate electrode are parallel to each other.

14. The integrated circuit of claim 8, wherein the first transistor is in a first standard cell, the second transistor is in a second standard cell abutting the first standard cell, and wherein the dummy gate electrode comprises a half in each of the first and the second standard cells.

15. A method comprising:
forming a first mask layer over an active region, wherein the active region extends into a first cell and a second cell abutting the first cell, and wherein the active region comprises a border portion comprising a first portion in the first cell and a second portion in the second cell;
patterning the first mask layer to form a first opening, wherein the border portion of the active region and a first channel portion of the active region are exposed through the first opening, and wherein the first channel portion is in the first cell;
performing a first channel doping to dope the border portion of the active region and the first channel portion of the active region simultaneously;
removing the first mask layer;
forming a second mask layer over the active region;
patterning the second mask layer to form a second opening, wherein the border portion of the active region and a second channel portion of the active region are exposed through the second opening, and wherein the second channel portion is in the second cell;

performing a second channel doping to dope the border portion of the active region and the second channel portion of the active region simultaneously;

removing the second mask layer; and forming a first and a second gate electrode overlapping the first and the second channel portions to form a first and a second transistor, respectively; and forming a dummy gate electrode overlapping the border portion, wherein the dummy gate electrode extends into the first and the second cells.

16. The method of claim 15, wherein the first channel doping is performed before the step of forming the first and the second gate electrodes.

17. The method of claim 15, wherein the first channel doping is performed after the step of forming the first and the second gate electrodes.

18. The method of claim 15, wherein the first and the second transistors are PMOS transistors, and wherein in the first and the second channel doping, n-type impurities are doped.

19. The method of claim 15, wherein the first and the second transistors are NMOS transistors, and wherein in the first and the second channel doping, p-type impurities are doped.

20. The method of claim 15, wherein the first and the second channel portions of the active region are doped to different doping concentrations.

* * * * *